(12) United States Patent
Mason et al.

(10) Patent No.: US 9,479,188 B1
(45) Date of Patent: Oct. 25, 2016

(54) PROGRAMMABLE MULTICHANNEL SIGNAL SELECTOR

(75) Inventors: Martin T. Mason, San Jose, CA (US); Jamaal Mitchell, Mountain View, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 898 days.

(21) Appl. No.: 12/790,796

(22) Filed: May 28, 2010

(51) Int. Cl.
   *H03M 1/12* (2006.01)

(52) U.S. Cl.
   CPC ......... *H03M 1/1205* (2013.01); *H03M 1/1225* (2013.01)

(58) Field of Classification Search
   USPC ............................................... 341/155
   See application file for complete search history.

(56) References Cited

U.S. PATENT DOCUMENTS

| | | | | | |
|---|---|---|---|---|---|
| 5,081,454 | A | * | 1/1992 | Campbell et al. | 341/141 |
| 5,168,276 | A | * | 12/1992 | Huston et al. | 341/141 |
| 5,200,751 | A | * | 4/1993 | Smith | 341/147 |
| 5,291,197 | A | * | 3/1994 | Abe | G06F 3/05 341/141 |
| 5,765,010 | A | * | 6/1998 | Chung et al. | 712/1 |
| 5,796,361 | A | * | 8/1998 | Levinson | 341/172 |
| 6,310,571 | B1 | * | 10/2001 | Yang et al. | 341/155 |
| 6,486,809 | B1 | * | 11/2002 | Figoli | 341/141 |
| 6,593,871 | B1 | * | 7/2003 | Miethig et al. | 341/157 |
| 6,906,655 | B1 | * | 6/2005 | Cox | 341/155 |
| 7,209,066 | B1 | * | 4/2007 | Trumbo | H03M 1/183 341/141 |
| 2003/0164783 | A1 | * | 9/2003 | Ahn | 341/141 |
| 2005/0248477 | A1 | * | 11/2005 | Jongsma et al. | 341/110 |
| 2006/0036704 | A1 | * | 2/2006 | Kanekawa | G06F 13/4217 709/208 |
| 2007/0019085 | A1 | * | 1/2007 | Suzuki | H04N 5/361 348/241 |
| 2007/0200745 | A1 | * | 8/2007 | Barrenscheen | H03M 1/1225 341/155 |
| 2009/0094393 | A1 | * | 4/2009 | Kobayashi | G06F 3/023 710/69 |
| 2009/0278717 | A1 | * | 11/2009 | Yang et al. | 341/141 |
| 2010/0051823 | A1 | * | 3/2010 | Brenner | H01L 27/14659 250/389 |
| 2010/0079649 | A1 | * | 4/2010 | Ayraud | H04N 5/3698 348/308 |
| 2010/0245143 | A1 | * | 9/2010 | Stanley et al. | 341/141 |
| 2011/0007873 | A1 | * | 1/2011 | Rudin | H04N 3/1593 378/62 |
| 2011/0043397 | A1 | * | 2/2011 | Carreau | 341/141 |
| 2011/0080925 | A1 | * | 4/2011 | Molina et al. | 370/538 |
| 2011/0102221 | A1 | * | 5/2011 | Guido et al. | 341/141 |

OTHER PUBLICATIONS

IC Package Types, Sep. 12, 2009, [online], [retrieved on Sep. 12, 2012] <URL: http://www.siliconfareast.com/ic-package-types.htm>.*

Breidenbach, M.; Frank, E.; Hall, J.; Nelson, D.; , "Semi-Autonomous Controller for Data Acquisition the Brilliant ADC," Nuclear Science, IEEE Transactions on , vol. 25, No. 1, pp. 706-710, Feb. 1978.*

Wei, Lee Chin and Long, Andrew. Synchronous Counters—Final Report [online]. Feb. 2001 [retrieved on Apr. 24, 2015]. Retrieved from the Internet:<URL:https://www.doc.ic.ac.uk/~nd/surprise_96/journal/vol4/cwl3/report.html>.*

* cited by examiner

*Primary Examiner* — Edward Dudek, Jr.
*Assistant Examiner* — Ralph A Verderamo, III
(74) *Attorney, Agent, or Firm* — TIPS Group

(57) ABSTRACT

An example programmable multichannel data converter includes a multiplexer having a plurality of input channels, an output and a channel selector input, a converter having an input coupled to the output of the multiplexer, and a controller having a user-configurable memory stack and control circuitry, the controller having a channel selector output coupled to the multiplexer.

6 Claims, 3 Drawing Sheets

PROGRAMMABLE MULTICHANNEL SIGNAL SELECTOR

BACKGROUND

In electronics, a multiplexer ("MUX") is a device that performs the process of multiplexing, i.e. selecting one of a number of signal inputs to provide a single signal output. The selection of a signal input is accomplished by a selector input which may be a single line if the MUX has only two inputs and which has multiple lines if the MUX has more than two inputs. In general, a MUX having $2^n$ inputs has n select lines ("select line bus").

Various input signals can be applied to the inputs of a MUX, including analog and digital signals. If all of the input signals are analog signals, the MUX may be referred to as an "analog MUX", and if all of the input signals are digital signals, the MUX may be referred to as a "digital MUX."

One area of technology which often uses an analog MUX is that of data acquisition ("DAQ"). DAQ systems convert analog electrical signals representing real world physical conditions into digital electrical signals for subsequent digital processing using an analog-to-digital converter ("ADC") which samples (or oversamples) the analog input signal to provide a digital output representing the magnitude of the analog input at the time of the sampling. Since accurate and high-speed ADCs are relatively expensive, a MUX is often used to coordinate multiple input "channels" to be input into an ADC.

FIG. 1 illustrates a conventional DAQ circuit 10 which may be implemented as a packaged integrated circuit 12. The DAQ circuit 10 includes an analog MUX 14 provided with analog input channels AIN(0)-AIN($2^n$-1) and a selector input S. The DAQ circuit 10 further includes an ADC 16 having an input coupled to the analog output of MUX 14 to provide a digital output DOUT.

The ADC 16 typically operates on the principle of oversampling by sampling the signal at the output of the MUX 14 with a sampling frequency that is significantly greater than twice the highest frequency of the signal being sampled. The conversion of the analog signal to a digital signal is known as a "convert." The channel of the MUX 14 is selected by the CHSEL( ) (channel select) bus which, in this example, is an n-line bus having lines CHSEL(0)-CHSEL(n-1). As a more concrete example, if n=4, the CHSEL( ) bus is a four-line bus and can control a $2^4$=16 channel MUX 14.

With continuing reference to FIG. 1, an optional register 18 may be provided as part of the channel select circuitry. A first example register 18A is shown in FIG. 2A and a second example register 18B is shown in FIG. 2B. As will be discussed, these registers allow for a limited amount of user configuration of the channel select sequence for the MUX 14.

In FIG. 2A, a 4-bit register 18A of the prior art is illustrated. This register can be used to configure the channel select sequence of MUX 14 in a "manual" mode. For example, a user can input the channel number to be selected by writing the channel number to the register. In this example, channel AIN(9) has been selected by entering the binary number "1001" at a time t and, at a time t+1 (typically the next clock cycle), the ADC converts the signal sampled on channel AIN(9). Alternatively, register 18A can be used to configure the channel select sequence of MUX 14 in a "scan channels" mode. For example, a user can input a maximum channel number M by writing the channel number to the register such that the channels are scanned from channel AIN(0) to AIN(M) in a repetitive fashion for conversion by the ADC. The sequence can be repeated without further instruction.

FIG. 2B illustrates an alternative register 18B which, in this example, is 16 bits long. Register 18B can be used to scan a custom set of channels. In this example, channels AIN(1), AIN(3), AIN(6), AIN(7), AIN(9), AIN(11), AIN(14), AIN(15) have been selected. The ADC converts these channels in ascending order, and the sequence may be repeated without further instruction.

A problem encountered with the use of registers in DAQ circuits of the prior art is that the configurability of the channel select pattern is quite limited. For example, prior art DAQ circuits, even if they have a scanning mode, only scan in an ascending order. Furthermore, the channel select patterns are quite limited and do not account for the needs of customers who wish to convert analog signals of different frequencies. This can result in gross oversampling of low frequency input signals and, therefore, less efficient system performance.

Another problem encountered with conventional DAQ circuit such as the one illustrated in FIG. 1 is that they create significant overhead with respect to a microcontroller or digital signal processor ("DSP") writing to the register. That is, each time a different channel of the MUX 14 is selected, an external processor must make the necessary calculations and input the channel select signal to select the proper channel. Since the external processor is often involved in other processes, this is a significant load on the processor any may tie up some of the system busses.

These and other limitations of the prior art will become apparent to those of skill in the art upon a reading of the following descriptions and a study of the several figures of the drawing.

SUMMARY

In an embodiment, set forth by way of example and not limitation, a signal selector includes a multiplexer having $2^n$ signal inputs, a signal output and an n-bit bus control input. In alternate embodiments, the multiplexer may have multiple outputs, such as for differential signals. The signal selector, in this example, further includes a controller having a digital memory and clocked logic, where the controller has a control output coupled to the control input of the multiplexer. The digital memory, in this example, is preferably configured as a plurality of n-bit data words which are independently addressable by the clocked logic.

In an embodiment, set forth by way of example and not limitation, an integrated circuit includes a semiconductor chip and an integrated circuit package enclosing the chip. The semiconductor chip includes a converter and a controller, where the controller includes a digital memory and clocked logic and has a control output including an n-bit bus. In this example embodiment, the digital memory is configured as a plurality of data words which are independently addressable by the clocked logic, wherein each of the plurality of data words includes at least n data bits.

In an embodiment, set forth by way of example and not limitation, a programmable multichannel data converter includes a multiplexer having a plurality of input channels, an output and a channel selector input, a converter having an input coupled to the output of the multiplexer, and a controller having a user-configurable memory stack and control circuitry, the controller having a channel selector output coupled to the multiplexer.

In an embodiment, set forth by way of example and not limitation, a method for autonomous data acquisition sequencing includes initializing a multichannel data converter for autonomous operation including inputting and storing a plurality of sequence codes in a multi-word read/write memory of the multichannel data converter, and autonomously operating the multichannel data converter by sequentially addressing words of the digital memory and reading sequence codes, activating a sequence of channel inputs based, at least in part, upon the plurality of sequence codes and acquiring data derived from channel inputs.

An advantage of certain embodiments set forth herein is that the selection of channels becomes extremely flexible, thereby increasing the efficiency of the system. Another advantage of certain embodiments set forth herein is that the apparatus can operate autonomously, decreasing the demand on external logic devices and systems.

These and other embodiments and advantages and other features disclosed herein will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTIONS

Figure 1:
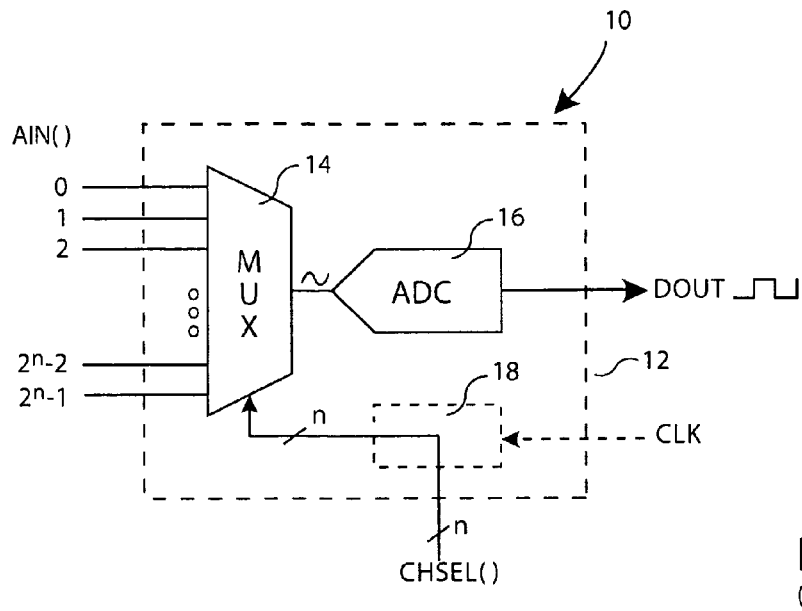
FIG. 1 is a block diagram of a conventional multichannel data converter.
Figure 2A:
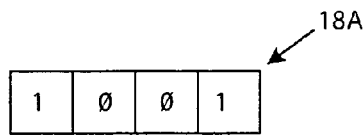
FIG. 2A is an example of a register of a multichannel data converter as illustrated in FIG. 1.
Figure 2B:
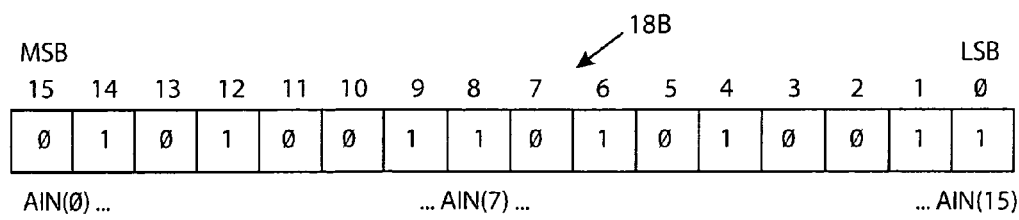
FIG. 2B is another example of a register of a multichannel data converter as illustrated in FIG. 1.
Figure 3:
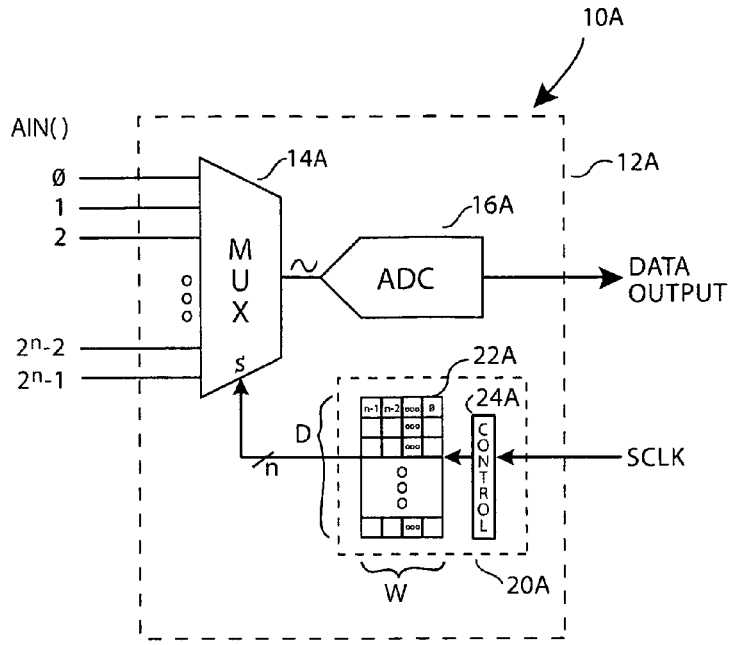
FIG. 3 is a block diagram of a first example embodiment of a programmable multichannel data converter.

FIGS. 1, 2A and 2B were discussed with reference to the prior art. In FIG. 3, a programmable multichannel data converter 10A, set forth by way of example and not limitation, may be implemented as an integrated circuit 12A. Typically, integrated circuit 12A includes the digital and analog circuitry formed on one or more semiconductor substrates and packaged within a plastic or ceramic body. A plurality of electrically conductive leads extend from the body of the IC to allow power, ground, and various signals to be applied to the circuitry within the integrated circuit.

In the non-limiting example of FIG. 3, a conventional analog MUX 14A and ADC 16A may be used as discussed with reference to the prior art. Multichannel data converter 10A further includes a controller 20 including a user configurable memory stack 22A and stack control circuitry 24A. The memory stack 22A has a width W and a depth D.

As used herein, "memory stack" or "stack" will refer to read/write memory configured to store two or more words of memory. By "word of memory" or "word" it is meant two or more bits of digital information which may be addressed by a single address. The stack can comprise random access memory (RAM) such as static random access memory (SRAM), dynamic random access memory (DRAM), flash memory, etc. The stack can be configured in a number of different fashions including random access, first-in-first-out (FIFO) stacks, last-in-last-out (LIFO) stacks, etc. The stack may also comprise a plurality of registers which are "addressed" by a clock signal (i.e. the counter 24 is not required in some embodiments).

The stack control circuitry 24A can be as simple as a clock interface to the stack 22A, if the stack 22A is configured, for example, as D registers of W bits. In another non-limiting example, the stack control circuitry can be a counter which is incremented (or decremented) by the system clock SCLK. The output of the counter 24A can serve as the address of a word in the stack 22A and thus provides for the selection of the one of the channels of the MUX 14A.

By providing a stack 22A which is more than a simple register, and by providing control circuitry 24A, the multichannel data converter becomes much more versatile. In the above example, the number of channels that can be sequenced has expanded to the depth D of the stack 22A. If, for example, the depth D is 256, a pattern of 256 channels can be selected. Furthermore, channels can be selected in ascending, descending and random orders, and high-frequency channels can be selected more frequently than low-frequency channels to increase the efficiency of the sampling process. Still further, once "programmed" with a desired sequence, the multichannel data converter 10A can operate autonomously, i.e. without, for example, any overhead burden on an external microcontroller or DSP.

In the example of FIG. 3, the MUX 14A has $2^n$ input channels requiring an n-bit bus at its S input. Also, in these examples, the width W of the stack, which is its word length, is also n. In many commercial applications, n will be at least 4, providing 16 input channels. In such embodiments, the depth D may be at least D=16 (to provide the ability to address each of the 16 channels at least once in a cycle) and, in certain embodiments, may be D=256 to provide many options as to the selection of the input channels.

Figure 4:
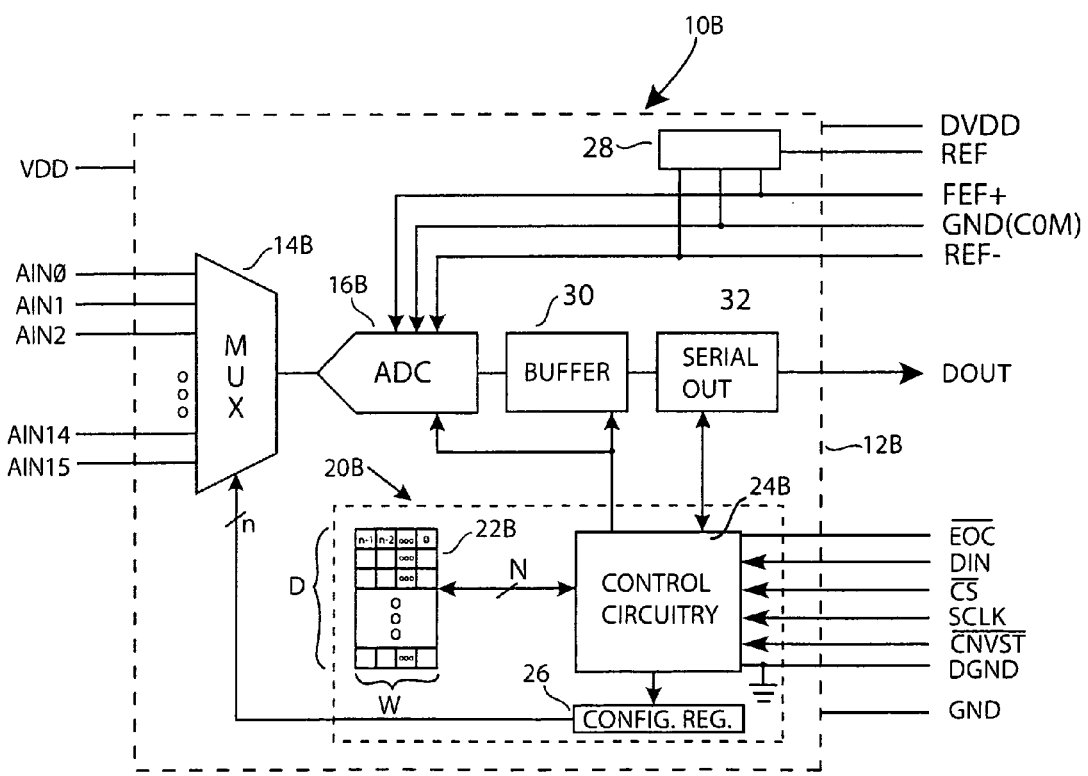
FIG. 4 is a block diagram of a second example embodiment of a programmable multichannel data converter.

FIG. 4 is a block diagram of another embodiment, set forth by way of example and not limitation, of a multichannel data converter 10B which, as in the previous example, may use a conventional MUX 14B and ADC 16B. The multichannel data converter 10B further includes a controller 20B including a user configurable memory stack 22B, stack control circuitry 24B and a configuration register 26. The multichannel data converter 10B also includes reference voltage circuitry 28, a buffer 30 and a serial output 32. In certain alternate embodiments, the REF input and reference voltage circuitry 28 may be omitted.

Various input/output ("I/O") are illustrated by way of example and not limitation in FIG. 4. A brief description of the example I/O is set forth below in Table 1.

TABLE 1

| | |
|---|---|
| AIN( ) | Analog inputs to MUX. |
| DVDD | Voltage source for the digital electronics |
| REF | Reference (optional) |
| REF+ | Positive reference bypass voltage. e.g. REF+ = GND(COM) + REF/2 |
| GND(COM) | Reference common bypass. e.g. COM = 13/25 * DVDD |
| REF− | Negative reference bypass voltage. e.g. REF− = GND(COM) − REF/2 |
| DOUT | Data output |
| $\overline{EOC}$ | End-of-conversion output |
| DIN | Data in |
| $\overline{CS}$ | Chip select to activate the control circuitry |
| SCLK | System clock |
| $\overline{CNVST}$ | Conversion start input |
| DGND | Data ground |

TABLE 1-continued

| | |
|---|---|
| GND | System ground |
| VDD | Voltage source for analog electronics |

The control circuitry 24B, in this non-limiting example, may be more sophisticated than the control circuitry described in previous examples. The control circuitry 24B can, by way of non-limiting examples, be implemented by one or more of discrete logic, a microcontroller and a state machine. The control circuitry 24B can implement relatively complex processes to autonomously control the operation of the multichannel data converter without any of the aforementioned overhead burden on, for example, an external microcontroller or DSP.

In an embodiment, set forth by way of example and not limitation, the stack 22B can include program instructions. To facilitate this embodiment, the width W of the stack 22B is greater than n. For example, the width W of the stack 22B can be 2n. In this way, n bits may be dedicated to program instructions and n bits can be dedicated to channel select data. When the control circuitry 24B addresses a word of the stack 22B which includes a program instruction, it can execute that program instruction or place it in a stack for future processing. Examples of program instructions include jump, skip, skip back, go to start, conditionals, etc. In this fashion, a user may cause the multichannel data converter to become fully programmable to perform complex and/or dynamic channel selection sequences.

Figure 5:
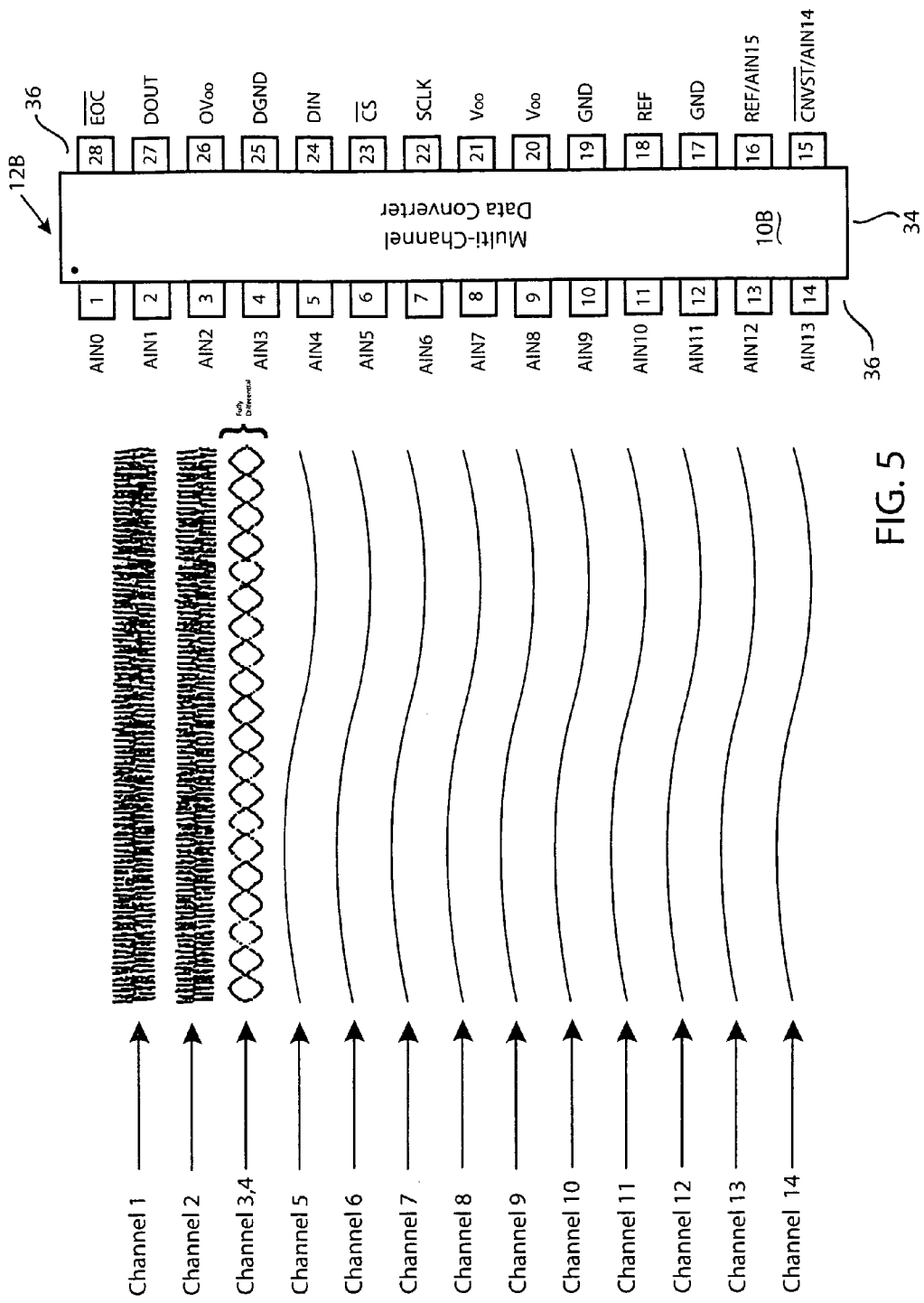
FIG. 5 is an illustration of an example operation of the second example embodiment of FIG. 4.

In FIG. 5, a multichannel data converter 10B is packaged as an integrated circuit 12B having a body 34 and a number of leads 36. A number of the aforementioned I/O signals may be multiplexed to reduce the lead ("pin") count of the integrated circuit 12B. In certain alternative embodiment, certain signals may not be necessary (e.g. the REF-signal on pin 16 and the CNVST signal on pin 15) so that all 16 outputs can be used without multiplexing.

Also shown in FIG. 5 are analog electrical signals of different frequencies which are applied to channels 1-14. More particularly, very high frequency signals are applied to channels 1 and 2, a fully differential signal of an intermediate frequency is applied to channels 3 and 4, and low frequency signals are applied to channels 5-14.

The desired sequencing of the channels can be programmed into the controller 20B by initializing the multichannel data converter including inputting and storing a set of sequence codes in the multi-word, read/write memory of stack 22B. This can be accomplished, by way of non-limiting example, using selecting the control circuitry 24B with the CS input and entering the data serially via the DIN port. The "sequence codes" can be a series of words stored in the stack 22B which comprise data, program instructions, or both. Once initialized, the multichannel data converter 10B can operate autonomously as noted above.

The multichannel data converter 10B is very flexible and can be programmed to operate in a great number of ways. As a general design rule, high frequency channels should be selected more frequently than lower frequency channels, and channels comprising differential signals should be selected sequentially. By way of non-limiting example, the channels illustrated in FIG. 5 might be selected as follows:

1/2/1/2/1/2/3/4/1/2/1/2/1/2/3/4/1/2/1/2/1/2/3/4/5/1/2/1/2/1/2/ 1/2/3/4/1/2/1/2/1/2/3/4/1/2/1/2/1/2/3/4/6 etc.

In this way, the highest frequency channels are sampled the most frequently, the medium frequency channels are sampled less frequently and the low frequency channels are sampled only occasionally.

It should be noted that the foregoing embodiments were directed to multichannel data converters by way of non-limiting examples. However, there are other applications where input signal selection is useful. For example, a data hub may have digital inputs at different frequencies and it may be useful to sequence the inputs in preference to the frequency of its data signal. In such embodiments, by way of non-limiting example, a signal selector may include a multiplexer and a controller which can operate autonomously. The multiplexer may, for example, have a number of input signals, a signal output and a control input and the controller may include a digital memory and clocked logic. A control output of the controller may be coupled to the control input of the multiplexer such that words of the digital memory can be independently addressable by the clocked logic.

It should also be appreciated that a MUX does not need to be integrated with a converter and a controller. For example, an integrated circuit may include a semiconductor chip having a converter and a controller enclosed within an integrated chip package. In this example embodiment, the converter has may have an input and an output and the controller may include a digital memory, clocked logic and, preferably, an n-bit bus. In this non-limiting example, the digital memory may be configured as a plurality o (i.e. two or more) data words which are independently addressable by the clocked logic, where each of the data words includes n data bits. In this example embodiment, the package may include a number of pins including pins electrically coupled to the input and the output of the converter and to the n-bit bus of the controller and the clocked logic may be at least one of a counter and control circuitry.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A signal selector comprising:
an analog multiplexer having $2^n$ analog signal inputs, an analog signal output and an n-bit bus digital control input;
a controller comprising a digital memory arranged as a stack having a width W and a depth D, a configuration register and control circuitry including clocked logic which is bidirectionally coupled to said digital memory to support both read and write operations on said digital memory and unidirectionally coupled to said configuration register to write to said configuration register, said controller having a control output derived from said configuration register that is coupled to said n-bit bus digital control input of said analog multiplexer, said digital memory being configured as a plurality of D data words which are independently addressable by said clocked logic, wherein each of said plurality of D data words includes n data bits, where W is greater than n such that for each of said plurality of D data words, some bits are dedicated to program instructions executable by said control circuitry and some bits are dedicated to channel select data, and wherein said clocked logic includes a counter and control circuitry including at least one of discrete logic, a microcontroller and a state machine, whereby the program instructions provide for autonomous operation;

an analog-to-digital converter (ADC) coupled to said control circuitry and having an ADC analog input coupled to said analog signal output of said analog multiplexer and an ADC digital output;

a reference voltage circuit coupled to said ADC;

a serial output circuit coupled to said control circuitry; and a buffer coupled to said control circuitry and connecting said ADC digital output to said serial output circuit.

2. An integrated circuit comprising:

a semiconductor chip including an analog multiplexer having $2^n$ analog signal inputs, an analog signal output and an n-bit bus digital control input;

a controller comprising a digital memory arranged as a stack having a width W and a depth D, a configuration register and control circuitry including clocked logic which is bidirectionally coupled to said digital memory to support both read and write operations on said digital memory and unidirectionally coupled to said configuration register to write to said configuration register, said controller having a control output derived from said configuration register that is coupled to said n-bit bus digital control input of said analog multiplexer, said digital memory being configured as a plurality of D data words which are independently addressable by said clocked logic, wherein each of said plurality of D data words includes n data bits, where W is greater than n such that for each of said plurality of D data words, some bits are dedicated to program instructions executable by said control circuitry and some bits are dedicated to channel select data, and wherein said clocked logic includes a counter and control circuitry including at least one of discrete logic, a microcontroller and a state machine, whereby the program instructions provide for autonomous operation;

an analog-to-digital converter (ADC) coupled to said control circuitry and having an ADC analog input coupled to said analog signal output of said analog multiplexer and an ADC digital output;

a reference voltage circuit coupled to said ADC;

a serial output circuit coupled to said control circuitry; and a buffer coupled to said control circuitry and connecting said ADC digital output to said serial output circuit; and a package enclosing said semiconductor chip.

3. A programmable multichannel data converter comprising:

an analog multiplexer having $2^n$ input channels, an output and a channel selector input having a n-bit bus;

an analog-to-digital converter (ADC) having an input coupled to said output of said multiplexer;

a reference voltage circuit coupled to said ADC;

a buffer coupled to an output of said ADC;

a serial output coupled to said buffer; and a controller comprising a user-configurable memory stack, a counter and control circuitry, said controller having a channel selector output coupled to said multiplexer, said controller being coupled to said ADC, said buffer and said serial output, wherein said memory stack is 2n bits wide and includes n bits reserved for program instructions, wherein the control circuitry is responsive to the program instructions to provide for autonomous operation of the multichannel data converter, wherein the controller comprises clocked logic which is bidirectionally coupled to said memory stack to support both read and write operations on said memory stack and unidirectionally coupled to a configuration register to write to said configuration register.

4. A programmable multichannel data converter as recited in claim 3 wherein said memory stack is at least 16 words deep.

5. A programmable multichannel data converter as recited in claim 3 wherein said memory stack is at least 256 words deep.

6. A programmable multichannel data converter as recited in claim 3 wherein said control circuitry is at least one of discrete logic, a microcontroller and a state machine.

* * * * *